United States Patent
Michal

(10) Patent No.: US 9,537,395 B2
(45) Date of Patent: Jan. 3, 2017

(54) SWITCHED MODE POWER SUPPLY PEAK-EFFICIENCY DETECTION

(71) Applicant: STMicroelectronics International N.V., Amsterdam (NL)

(72) Inventor: Vratislav Michal, Grenoble (FR)

(73) Assignee: STMicroelectronics International N.V., Amsterdam (NL)

( * ) Notice: Subject to any disclaimer, the term of this patent is extended or adjusted under 35 U.S.C. 154(b) by 139 days.

(21) Appl. No.: 14/518,039

(22) Filed: Oct. 20, 2014

(65) Prior Publication Data

US 2015/0108956 A1  Apr. 23, 2015

(30) Foreign Application Priority Data

Oct. 21, 2013  (EP) .................................... 13306449

(51) Int. Cl.
| | |
|---|---|
| *G05F 1/56* | (2006.01) |
| *H02M 3/158* | (2006.01) |
| *H02M 1/088* | (2006.01) |
| *H03K 17/12* | (2006.01) |
| *H02M 1/00* | (2006.01) |

(52) U.S. Cl.
CPC ............... *H02M 3/158* (2013.01); *H02M 1/00* (2013.01); *H02M 1/088* (2013.01); *H03K 17/122* (2013.01); *H02M 2001/0048* (2013.01); *H02M 2001/0054* (2013.01); *H03K 2217/0036* (2013.01); *Y02B 70/1491* (2013.01)

(58) Field of Classification Search
CPC ............. H02M 2001/0048; H02M 2001/0054; H02M 3/158; H02M 1/088

USPC .......................................... 323/282–289, 315
See application file for complete search history.

(56) References Cited

U.S. PATENT DOCUMENTS

2006/0285366 A1* 12/2006 Radecker .......... H02M 3/33507
363/16
2008/0111529 A1  5/2008 Shah et al.
(Continued)

FOREIGN PATENT DOCUMENTS

DE  102011014165 A1  9/2012
WO  WO-2008135637 A1  11/2008

OTHER PUBLICATIONS

EPO Search Report and Written Opinion for EP 13306449.3 dated Apr. 4, 2014 (8 pages).

*Primary Examiner* — Adolf Berhane
*Assistant Examiner* — Nusrat Quddus
(74) *Attorney, Agent, or Firm* — Gardere Wynne Sewll, LLP

(57) ABSTRACT

A peak efficiency detection system may include a switched power supply (SPS) module providing an output supply signal. The SPS module may have an internal node, and a plurality of SPS circuits configured to generate the output supply signal on the internal node. A dead type module may generate control signals. A central node external to the SPS module may deliver the output supply signal to a load module. A power stage size control module may generate control signals for controlling the SPS module. A peak-efficiency detection (PED) module may receive the output supply signal from the central node, the control signals from the SPS module, and the control signals from the power stage size control module. The PED module may generate a signal representative of an efficiency of the SPS module.

20 Claims, 13 Drawing Sheets

(56) References Cited

U.S. PATENT DOCUMENTS

| | | | |
|---|---|---|---|
| 2010/0308786 A1* | 12/2010 | Joos | H03K 17/166 323/284 |
| 2011/0103098 A1* | 5/2011 | Wu | H02M 1/36 363/17 |
| 2013/0176015 A1 | 7/2013 | Sato et al. | |
| 2014/0049997 A1* | 2/2014 | Freeman | H02M 7/539 363/97 |
| 2015/0036389 A1* | 2/2015 | Freeman | H02M 1/10 363/16 |

* cited by examiner

SWITCHED MODE POWER SUPPLY PEAK-EFFICIENCY DETECTION

RELATED APPLICATION

This application claims the priority benefit of European Patent Application Number 13306449.3, filed on Oct. 21, 2013, entitled "SWITCHED MODE POWER SUPPLY PEAK-EFFICIENCY DETECTION", which is hereby incorporated by reference to the maximum extent allowable by law.

TECHNICAL FIELD

This disclosure relates, generally, to switched mode power supplies, and, more particularly, to techniques for detecting a peak efficiency of a switched power mode supply.

BACKGROUND

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

Switched Mode Power Supply (SMPS) DC/DC converters are used in an increasing number of electronic applications, such as cellular phones, laptop computers, etc., due to their higher efficiency than linear power supplies. Indeed, SMPS have lower power losses than linear power supplies. Another advantage of SMPS is their capability to provide a stabilized supply current or supply voltage to a load.

Controlling the stability of the power supply signal is a challenge for SMPS manufacturers. Indeed, electronic devices such as tablets or cellular phones, for instance, desire a well stabilized continuous voltage supply despite variations of temperature and variations of power consumption during their use for a phone call or during video recording, for instance. To meet this, it is useful to continuously control the voltage supplied to the electronic device and to adjust the operation of the SMPS.

An approach allowing controlling of the supply voltage delivered to the load by an output stage of the SMPS can include continuously monitoring the output voltage with a controller generating a duty-cycle signal delivered to the power-stage comprised of power switches such as power metal oxide semiconducting (MOS) transistors.

One potential drawback of this approach, however, is that it may be difficult to efficiently control the output supply voltage so as to accurately account for the intrinsic losses of the MOS transistors. These include static and dynamic contributions, namely ohmic losses and switching losses. Indeed, with an aim to increase the life-time of the battery, for instance, it is helpful to determine the losses of the SMPS with respect to the power requests of the load. As a result, the size of the output stage can be dynamically optimized in order to avoid extra power losses inside the SMPS during discharge of the battery, due to the switching losses occurring during normal operation of the device.

SUMMARY

The present disclosure provides an alternative approach for controlling efficiency of the switched power supply module with an aim to achieve the highest possible power efficiency for a given operating point. The system disclosed herein is both reliable and efficient, and is, in addition, economical to manufacture.

According to a first aspect, there is a peak efficiency detection (PED) system that may include a switched power supply (SPS) power stage module configured to provide an output supply signal. The SPS power stage module may include an internal node, and a plurality of SPS circuits configured to generate the output supply signal on the internal node. The SPS power stage module may also include a dead-time module configured to generate two control signals with a small non-overlap time.

A power stage size control module may be configured to provide at least two digital control signals for controlling the SPS module. The PED system may also have a central node external to the SPS module and configured to deliver the output supply signal to a load module. A PED module may be configured to receive the output supply signal from the central node, the control signals from the SPS module, and signals from a power stage size control module. The PED module may be configured to provide a signal representative of an efficiency of the SPS module. The PED module may include a signal formatting module configured to provide a formatted signal from the output supply signal, and a loss replica module configured to provide a signal representative of ohmic and switching losses of the SPS module based on the formatted signal.

The SPS module may be configured to activate or deactivate at least one of the SPS circuits operating to generate the output supply signal on the internal node, when the signal generated by the PED module and representative of the efficiency of the SPS module is lower than a threshold value, which indicates that the switching losses of the SPS module are greater than the ohmic losses, or when the signal representative of the efficiency of the SPS module is higher than the threshold value, which indicates that the ohmic losses of the SPS module are greater than the switching losses.

In an exemplary embodiment, the SPS circuits include at least one power switch, and the power switch may be constructed from a power MOS transistor.

In an exemplary embodiment, data transfers may be performed so as to allow communication between the PED module, the power stage size control module, and the SPS module.

Moreover, in other exemplary embodiments, in order to obtain accurate replica ohmic losses, the loss replica module includes at least a sense field effect transistor (FET) configured to create an image of the current delivered to the output by the SPS circuits. This replica is done with a scale ratio in order to deliver a current that helps creates an image of the ohmic losses of the SPS circuits.

Further, in order to obtain accurate replica switching losses, the switching losses module may include an auxiliary capacitor, such as a MOS capacitor, constructed by a MOS transistor configured to be charged by the current representative of the ohmic losses of the SPS circuits and to derive therefrom a voltage representative of the power losses of the activated SPS circuits.

In a second aspect of the disclosure, there is a method of operating a peak efficiency detection system, PED, for a SMPS. The method may include providing the output supply signal on an internal node central to the SPS module, using at least some of the SPS circuits. Two control signals may be provided by a dead time module. The output supply signal may be delivered to the load module by a central node external to the SPS module. The output supply signal from the central node, the control signals from the SPS module, and signals from a power stage control module may be sent to the PED module. A signal representative of the efficiency of the SPS module may be generated by the PED module. A formatted signal from the output supply may be generated by the SPS module, and a signal representative of the ohmic and switching losses of the SPS module may be generated by the loss replica module. The control signals mentioned above may be generated by a power size control module.

In some applications, the duration of conduction of the switched power circuits may be controlled by the duty cycle of the control signals. In further applications, each transistor of each SPS circuit may be activated by the control signals.

BRIEF DESCRIPTION OF THE DRAWINGS

Embodiments of the present disclosure are illustrated by way of example, and not by way of limitation, in the figures of the accompanying drawings, in which like reference numerals refer to similar elements and in which.

DESCRIPTION OF PREFERRED EMBODIMENTS

Embodiments as described herein are directed to a device and a method for adjusting a number of switched power supply (SPS) circuits, also referred to as power stage segments, to obtain optimal peak efficiency of a SPS module.

Figure 1:
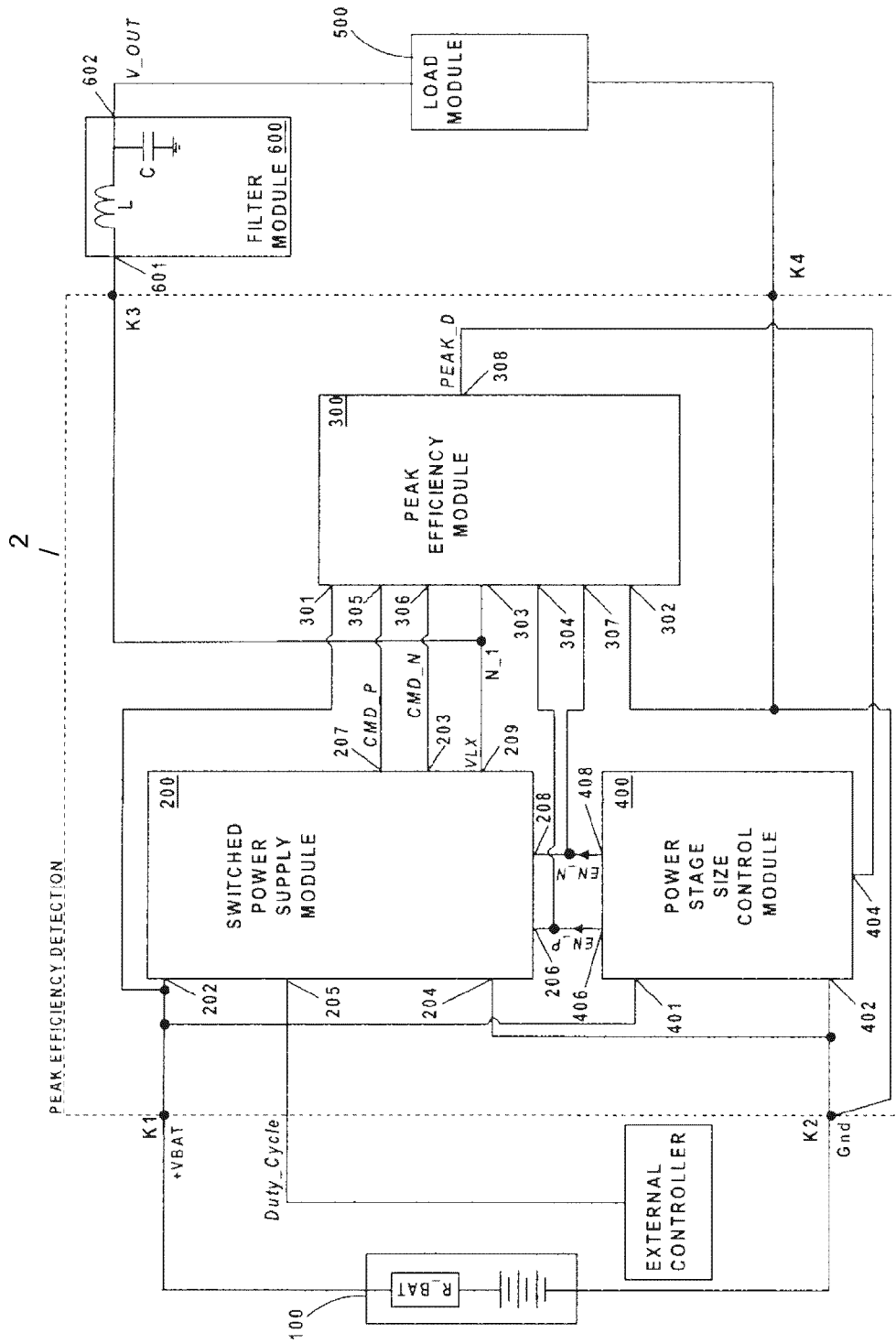
FIG. 1 is a simplified block diagram of a switched mode power supply device containing a peak-efficiency detection (PED) module, in accordance with this disclosure.

Referring to FIG. 1, there is shown therein a simplified block diagram of a peak efficiency detection (PED) device 1 containing a power-stage module, to which embodiments of this disclosure can be applied.

The PED device 1 may be run upon start-up of electronic devices such as a tablet, which is supplied by a switched mode power supply (SMPS) embodying the PED device 1. Indeed, the SMPS device 1 has applications for controlling a current or a voltage supply delivered to a load when, for instance, the temperature of electronic components vary during operation of the electronic device, or when the activity of the electronic device increases, for instance, during a phase of operation that has high power consumption, such as video recording.

In one embodiment of the disclosure, the PED device 1 comprises three main blocks including a first main block referred to as SPS module 200, a power stage adapted to provide an output voltage VLX to a filter module 600, a second main block referred to as PED module 300 and adapted to provide a signal PEAK_D representing the efficiency of the SPS module 200, and a third main block referred to as power stage size control module 400 and adapted to provide a first control signal EN_P and a second control signal EN_N to control the SPS module and the PED module 300 based upon a determined strategy which will be described in more detail below.

Further, the PED device 1 includes two input terminals K1 and K2 coupled to a power supply voltage source 100, and two output terminals K3 and K4 to which a filter module 600 is coupled.

The PED device 1 includes an internal node N_1 adapted to couple the power supply signal VLX from the SPD module 200 to the PED module 300, and to the load module 500 through the filter module 600.

The source may be a battery or other type of power supply voltage generator 100 able to provide a DC voltage such as the voltage +VBAT referenced to Gnd. The source 100 is coupled to the input terminals K1 and K2, respectively, of the PED device 1. In the shown example, the power supply voltage generator 100 includes an internal parasitic resistor R_BAT representative of the internal resistance of the generator 100. The load module 500 could be an electronic circuit of a cellular phone or a laptop computer, for instance. These examples are not restrictive of the many applications of the proposed device.

The filter module 600, coupled between the output terminal K3 and the load module 500, comprises an inductor (L) coupled with a capacitor (C) and allows the obtainment of a particular cut-off frequency determined by the inductor and capacitor values. The filter module 600 is adapted to receive the output signal VLX from the central node N_1 through the output terminal K3, and is adapted to provide a smoothed signal V_OUT to an input of the load module 500. The filter module 600 can include several additional components (capacitors, resistors, and inductances), and these components may be integrated during the forming of the PED device 1 on a silicon chip.

Figure 2:
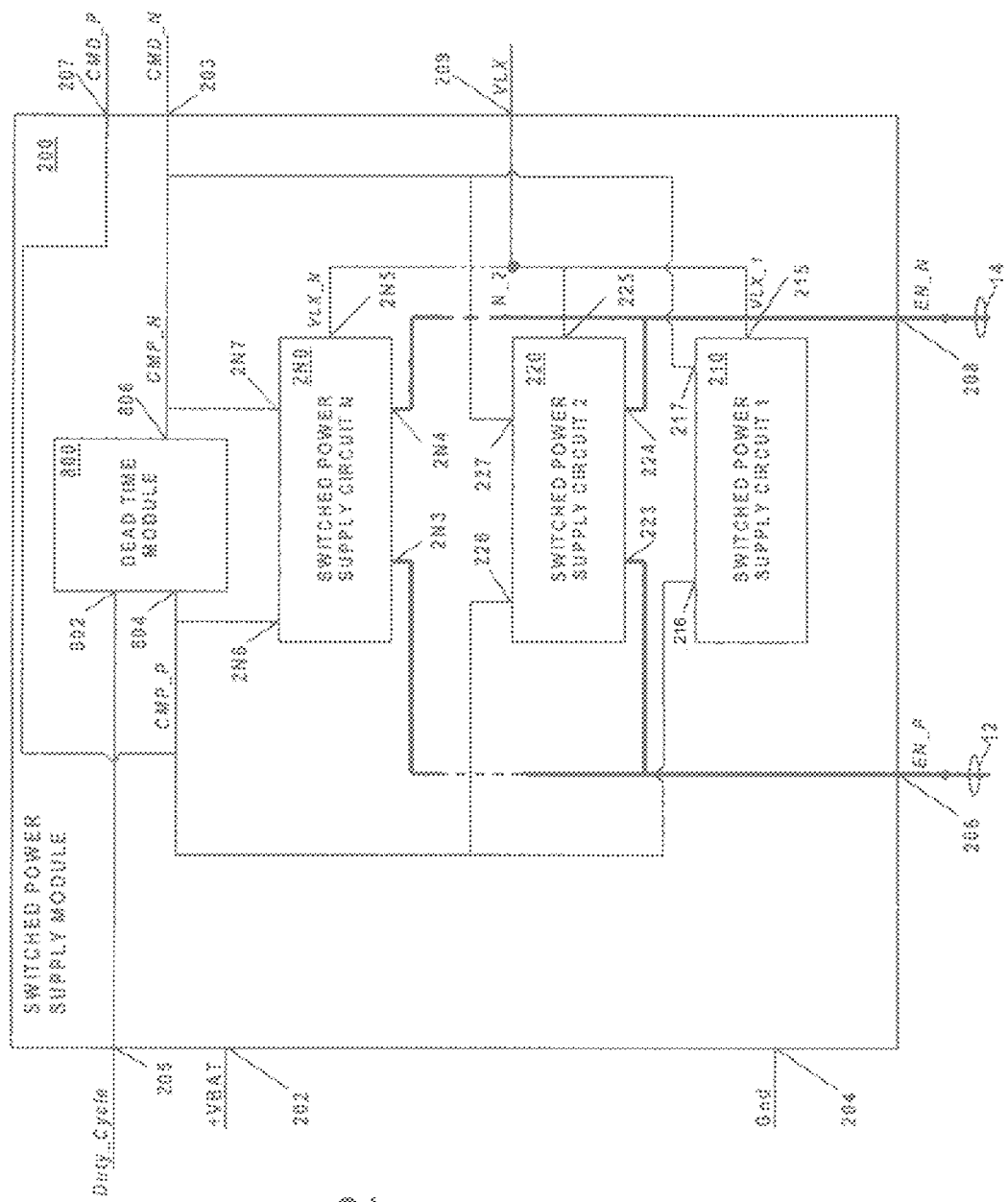
FIG. 2 is a simplified block diagram of an embodiment of the SPS module of FIG. 1 with a variable size.

The SPS module 200 as shown on FIG. 2 includes a plurality of SPS circuits 210, 220, . . . , 2N0, a dead time module 800, two power supply inputs 202 and 204 for supplying the SPS circuits, two other inputs 206 and 208 adapted to receive two control signals EN_N and EN_P from the power stage size control module 400, an input 205 adapted to receive a signal Duty_Cycle that allows control of the duration of conduction of the switched power supply circuits, an output 209 adapted to provide the supply signal VLX to the central node N_1 of the PED device 1, and two outputs 207 and 203 adapted to provide two signals CMD_P and CMD_N. Further, the SPS module 200 includes an internal node N_2 which is identical as N_1 node.

The dead time module 800 is adapted to receive at an input 802 the Duty_cycle signal from an external controller, and to provide on a first output 804 a signal CMD_P and on a second output 806 a signal CMD_N. These signals are slightly non-overlapping. The frequency and duration of a high state of the Duty_cycle signal are adjustable by an external controller.

The SPS circuit 210, is adapted to receive, on inputs 216 and 217, two input signals from the dead time module 800, with the first input signal CMD_P enabling control of the duration of the conduction of a PMOS transistor of the switched power supply circuit 210 and with the second input signal CMD_N enabling control of the duration of conduction of a NMOS transistor of the circuit. The switched power supply circuit 210 includes an output 215 adapted to provide a supply signal VLX_1 to the internal node N_2 of the switched power supply module 200.

The switched power supply circuit 220, for instance, includes two inputs 226 and 227 adapted to receive two input signals CMD_P and CMD_N from the dead time module 800 that enable control of the duration of conduction of the PMOS and NMOS transistors of the circuit. Furthermore, the switched power supply circuit 220 includes two other inputs 223 and 224 adapted to receive respectively the signals EN_P 220 and EN_N 220 from the from the power stage size control module 400 through the inputs 206 and 208 of the SPS module 200. These signals (EN_P220 and EN_N220) allow activating or deactivating each transistor of each SPS circuit based upon a defined power regulation strategy that will be described in more detail below. The SPS circuit 220 has an output 225 adapted to provide a signal VLX_2 of the SPS module 200 as its contribution to the generated output supply voltage VLX. The signal VLX is representative in the following description to the power delivered by the activated SPS circuit (210, 220, . . . , 2N0) of the SPS module 200.

For the sake of simplicity of the present description, the SPS circuit 220 has been described but it should be appreciated that, referring to the FIG. 2, any such SPS circuit (without the switched power supply circuit 210) may have the same internal characteristics and the same internal design. Furthermore, the number of SPS circuits and their characteristics may be defined during the design of the SPS module 200 depending on the specific application. To that end, they may be integrated in a same chip for reaching a minimum mismatch of characteristics. Further, the outputs of the SPS circuits may be coupled to the internal node N_2 of the Switched Power Supply module 200.

Referring to FIG. 1, the power stage size control module 400 includes an input 404 adapted to receive the signal PEAK_D from an output of the PED module 300, and includes two outputs 406 and 408 adapted to provide two signals EN_P and EN_N, respectively. The first signal EN_P and the second signal EN_N enable activation or deactivation of each PMOS transistor and NMOS transistor of each switched power supply circuit based upon the signal PEAK_D and a defined strategy that will be described in more detail bellow.

As presented above, one of the goals of the PED module 300 is to detect the peak efficiency of the SPS module 200. To that end, the losses in the SPS circuit 200 are determined during the operation of the SPS module 200 in order, for instance, to avoid the power losses. The efficiency of the device is mainly determined by the configuration of the SPS module 200, particularly the size of the associated power MOS transistors. Mainly, two set points can control the efficiency of the SPS module 200.

The first point of control is the size of the structure, which may be optimized during the formation of the power MOS transistors used in the SPS module 200 and their associated circuitry. Further, the number of activated SPS circuits may be dynamically adapted as a function of the power needs of the load 500.

The second point which allows obtaining high efficiency for the SPS module 200 is the power stage size control module 400. Indeed, this module enables activation or deactivation of each power MOS transistor of the SPS circuits depending on the power needs of the load 500 and other parameters of the circuit. The power stage size control module 400 is adapted to provide several control signals to the SPS module 200 in order to control the number of activated switched power stage circuits, and the duration of the conduction of the SPS circuits. The power stage size control module 400 presented above is adapted to monitor several parameters such as number of activated SPS circuits and the duration of conduction of the PMOS and NMOS transistors of the SPS module 200 for controlling the output supply signal VLX.

The power supply signal VLX (as shown on FIG. 2) provided by the SPS module 200 results from the addition of the contributions provided by the activated SPS circuits summed at the internal node N_2 according to Kirchoff's laws. The activation of each PMOS and NMOS transistor of the SPS circuits in accordance with a power regulation strategy is performed by signals EN_N and EN_P. A direct coupling by the communication bus 12 may be used to provide the EN_N and EN_P signals. In these examples, the EN_N and EN_P signals can include an address signal and a command signal allowing activation or deactivation of each of the SPS subcircuits based upon the defined strategy.

Two other parameters may allow controlling the power supply signal VLX, such as control of the frequency and the duty cycle of the signals CMD_P and CMD_N. For explaining the influence of these parameters on the power supply signal VLX, the internal structure of a switched power supply circuit will be first described.

Figure 3:
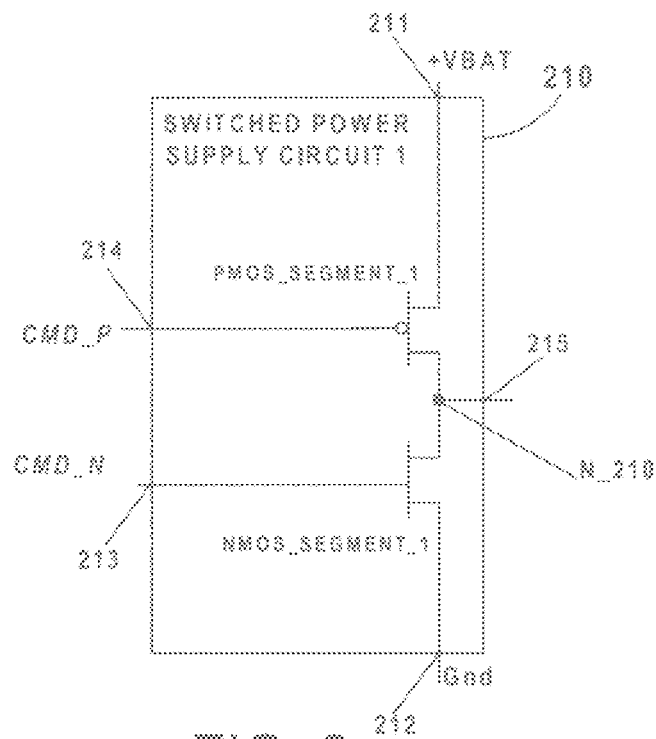
FIG. 3 is a simplified block diagram of one of a plurality of a SPS circuits included in the SPS module of FIG. 2.
Figure 4:
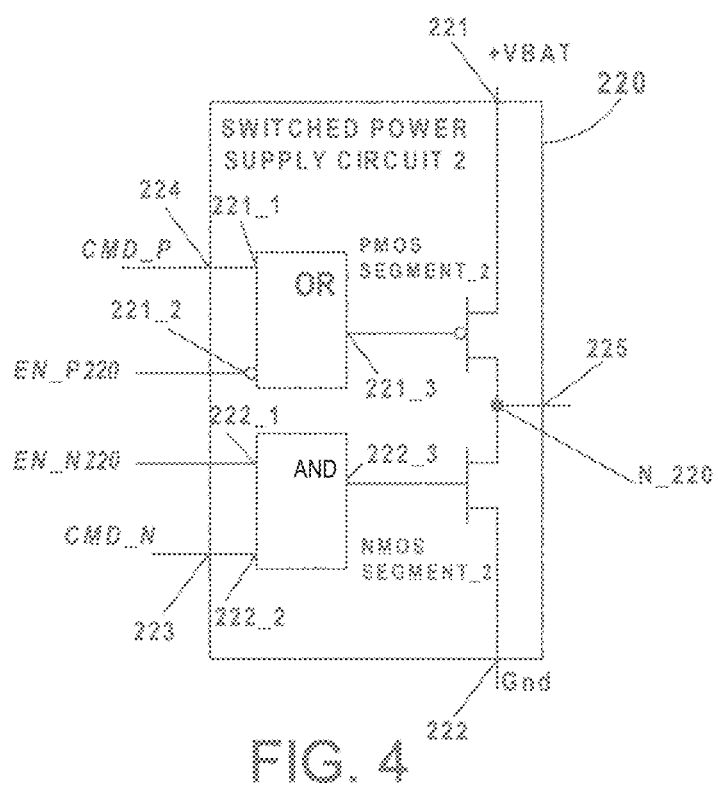
FIG. 4 is a simplified block diagram of another embodiment of the SPS circuits included in the SPS module of this disclosure.
Figure 5:
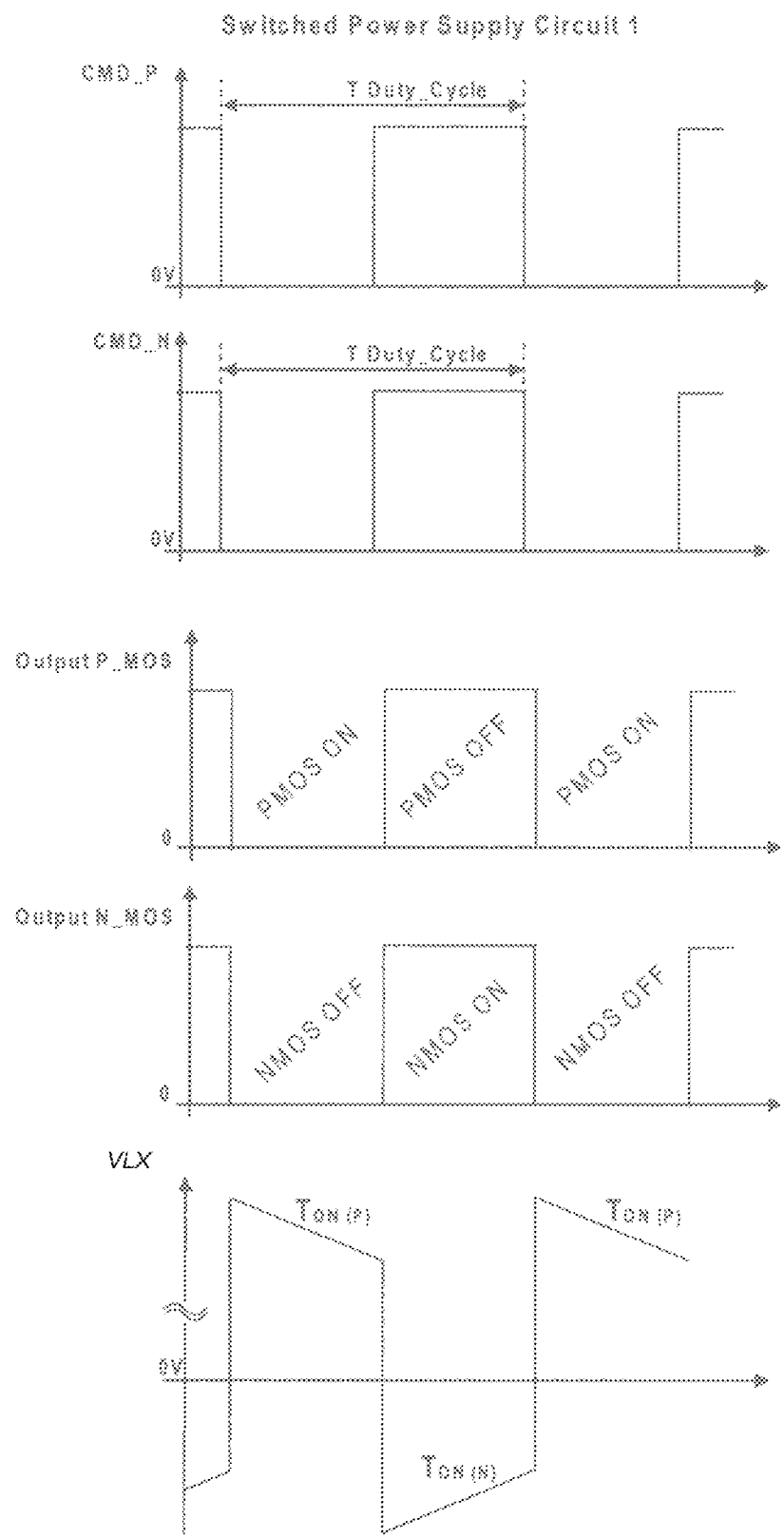
FIG. 5 shows a sequence, as a function of time, of signals and voltages of the device disclosed herein.

FIG. 3 and FIG. 4 show two examples of internal structure of a SPS circuit and FIG. 5 shows various associated signals. It should be appreciated that the SPS circuit 220 will be described in detail, and that this description is valid for the other SPS subcircuits as well. Furthermore, it should be appreciated that, on FIG. 5, the duty cycle of signals CMD_P and CMD_N is equal to 0.5.

The SPS circuit 210 shown in FIG. 3 comprises two power MOS transistors with a first PMOS transistor PMOS_SEGMENT_1, a second NMOS transistor NMOS_SEGMENT_1. A gate of the transistor PMOS_SEGMENT_1 is coupled to the input 214 of the switched power supply circuit 210 and is adapted to be controlled by the signal CMD_P. A gate of the transistor NMOS_SEGMENT_1 is coupled to the input 213 of the circuit and is adapted to be controlled by the signal CMD_N. Further, a source of the transistor PMOS_SEGMENT_1 is coupled to VBAT, and source of the transistor NMOS_SEGMENT_1 to GND. A node 210 on FIG. 3 placed is between the drains of the two transistors and is adapted to dispense the signal VLX_1 through the output 215 of the switched power supply circuit 1. As the transistors in this segment are hard coupled to the CMD_P and CMD_N signals, this first segment is active (means that it may not be deactivated in some situations).

The switched power supply circuit 220 shown on FIG. 4 includes two MOS transistors with a first transistor PMOS_SEGMENT_2, and a second transistor NMOS_SEGMENT_2, and also includes two logical structures OR and AND. The logical structure OR is adapted to receive at a first input 221_1 the signal CMD_P from the dead time module 800, and on a second input 221_2 the signal EN_P2 from the power stage size control module 400. The logical structure OR is adapted to provide on an output 221_3 a signal representative of an OR-boolean calculation between the two input signals. The output 221_3 of the logical structure OR is coupled to a gate of the transistor PMOS_SEGMENT_2.

The logical structure AND is adapted to receive on a first input 222_1 the signal CMD_N from the dead time module 800 and on a second input 222_2 the signal EN_N2 from the power stage size control module 400. The logical structure AND is adapted to provide on an output 222_3 a signal representative of an AND boolean calculation between the two input signals. The output 222_3 of the logical structure AND is coupled to a gate of the transistor NMOS_SEGMENT_2.

Further, a node N_220 on the FIG. 5 placed between the drains of the two transistors is adapted to provide the signal VLX_2 through the output 225 of the switched power supply circuit 2.

In one embodiment, the signals CMD_P and CMD_N of the inputs 12 and 14 have the same shape (as shown in FIG. 5). In other embodiment, a delay may be created between the two signals CMD_P and CMD_N, this delay allowing avoidance of the risk of crossconduction due to the simultaneous conduction of the two transistors.

The graphs on FIG. 5 shows different signals and illustrates different states of the transistors during one period of operation. The output signal VLX_1 (FIG. 5) is the sum of the output signals of the transistor PMOS SEGMENT_1 and NMOS_SEGMENT_1 when they are in the "ON" states. The range values of the output signal VLX_1 depends on the voltage value +VBAT.

In another embodiment, the frequency and the duty cycle of the signals CMD_P and CMD_N allow control of the duration of conduction of each transistor such that if the low state duration of the signal CMD_P and CMD_N is higher than the duration of conduction of the transistor PMOS, SEGMENT_1 will be longer and the duration of conduction of the transistor NMOS SEGMENT_1 will be shorter, and vice versa. This principle of operation of the transistors is known to those of skill in the art as the commutation mode. Thereby, the output power supply signal VLX_1 can be controlled by the duty cycle and the frequency of the signals CMD_P and CMD_N.

As in some DC/DC converters, the power losses are the sum of switching (dynamic) and ohmic or joule (static) losses. The former stem from driving the transistor parasitic gate capacitances commonly referred to as $C_{G(N)}$ and $C_{G(P)}$. The later stem from parasitic resistances including intrinsic NMOS and PMOS channel resistances commonly referred to as the $R_{ON(N)}$ and $R_{ON(P)}$ resistances, in addition to the resistance of the metallic connections. A simplified schematic of a switched power supply circuit containing these parasitic elements is shown on FIG. 6.

Figure 6:
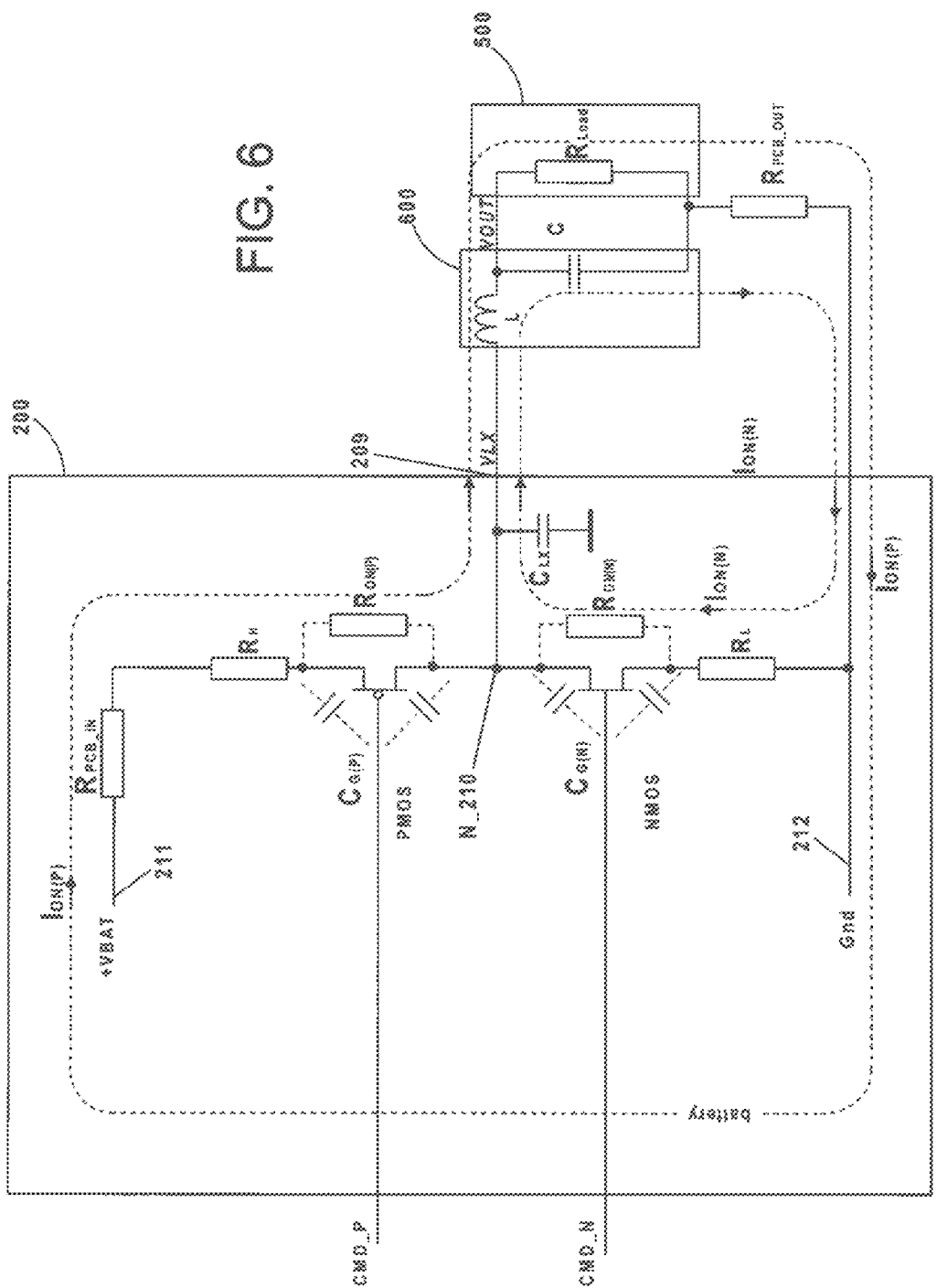
FIG. 6 is more detailed circuit diagram showing the internal structure of a SPS circuit including the main lossy elements, in accordance with this disclosure.

In FIG. 6, two current paths are represented. A first current path, $I_{ON(P)}$ for the PMOS transistors, occurs during the PMOS transistors' conduction phase. A second current path, $I_{ON(N)}$ for the NMOS transistors, occurs during the NMOS transistors' conduction phase. $R_{ON(N)}$ and $R_{ON(P)}$ are the ON-channel resistances of the PMOS and NMOS transistors, respectively. $R_H$ and $R_L$ are the source and drain metallic access resistances of the transistors. Resistances $R_{PCB,IN}$ and $R_{PCB,OUT}$ are the sum of the remaining input and output wiring resistances, which are encountered in the current path of $I_{ON(N)}$ and $I_{ON(P)}$ (e.g. PCB routing resistance, package access resistances, input filter, etc.). A capacitance C of the output of the switched power supply circuit is further shown in FIG. 6, which may be dominated by the sum of NMOS and PMOS drain overlap and junction capacitances. An inductance (not shown) may be coupled to the capacitor and resistor of the load module 500.

Figure 7:
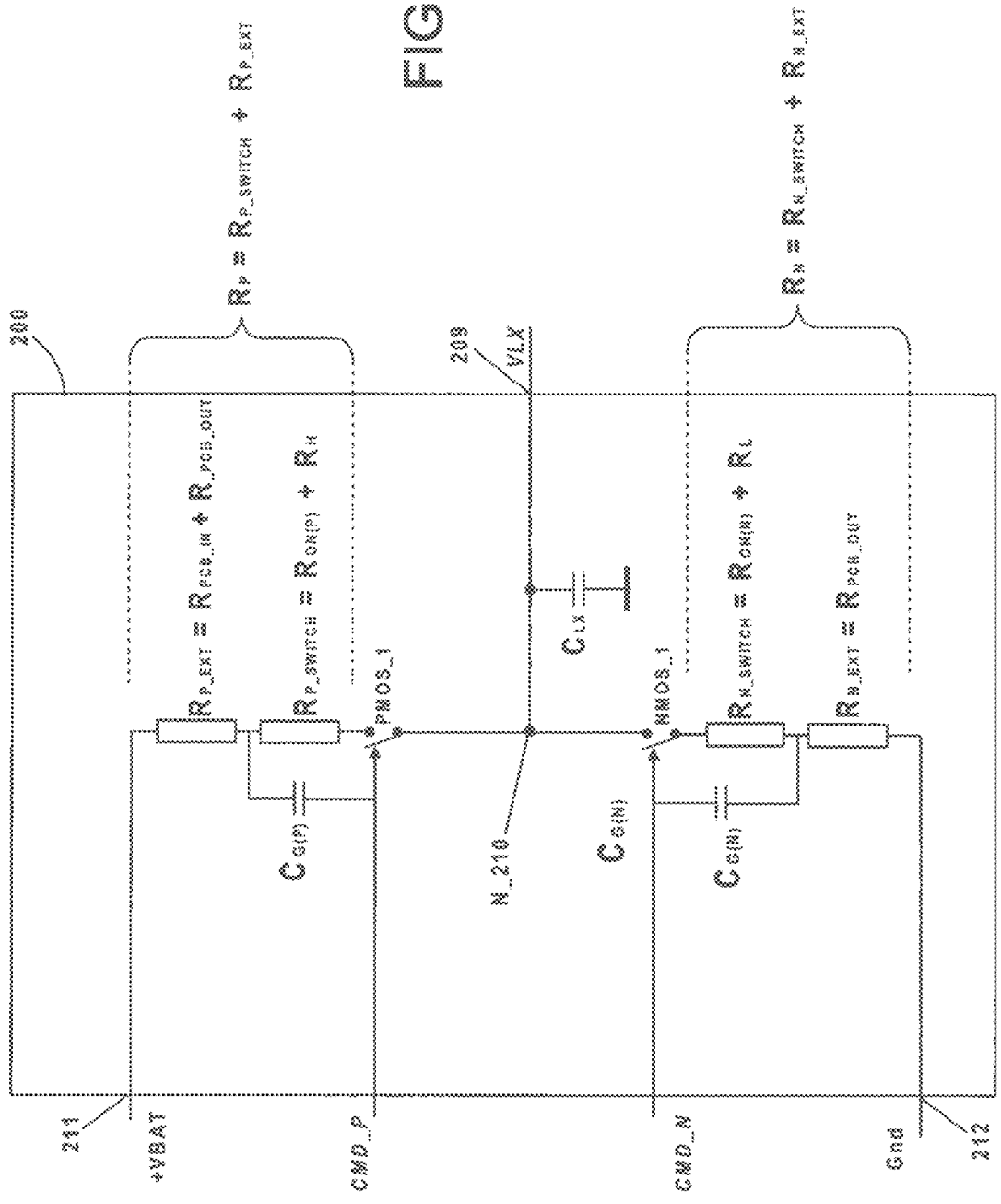
FIG. 7 is a more simplified circuit diagram showing the internal structure of a SPS circuit including main lossy elements, in accordance with this disclosure.

For a better understanding, the equivalent circuit on the FIG. 6 can be simplified into the circuit shown in FIG. 7. In this schematic, $R_{N,P}$ are the resistances related to the ohmic losses during the NMOS and PMOS conduction phases, and $R_{P\_SWITCH}$, $R_{N\_SWITCH}$ are the resistance of switches inside the package (MOS $R_{ON}$ with metallic access resistance). Further, $R_{N\_EXT}$, $R_{P\_EXT}$ are the sum of the external resistances. The losses in a SPS module 200 comprised of power MOS transistors can be represented mathematically as:

$$P_{LOSSES} = R * I_{OUT}^2 + C V^2 f_{CLK} \quad (1)$$

with:

$$R = D R_P + (1-D) R_N \quad (2)$$

where R is the average resistance of the system, C is the sum of all parasitic capacitances (charge/discharged) with $f_{CLK}$ rate, $f_{CLK}$ is the clock frequency of the Duty_cycle signal, Iout is the DC output current, D is the high state of the Duty_cycle signal, and (1−D) is the low state of the Duty_cycle signal.

The device and method disclosed herein allow the determination of the maximum peak efficiency of the SPS module 200, by deriving the output current Iout in equation 2, so that:

$$I_{OUT(max\eta)} : \frac{d\eta}{dI_{OUT}} = 0 \quad (3)$$

where η is the efficiency of the Supply Power Stage defined as η=Pout/Pin, and $I_{OUT}$ is the output current.

The output current corresponding to the peak efficiency operations of a given power switch (i.e. PMOS or NMOS) results from the previous as:

$$I_{OUT(max\eta)} = V_{BAT} \sqrt{\frac{C \cdot f_{CLK}}{T_{ON} \cdot R}} \quad (4)$$

where TON is the conduction time of the related switch (PMOS or NMOS).

The formula presented above signifies that the peak efficiency occurs when switching and ohmic losses are equal, namely when:

$$\underbrace{R I_{OUT(max\eta)}^2}_{\text{ohmic losses}} = \underbrace{C V_{BAT}^2 f_{CLK}}_{\text{switching losses}} \quad (5)$$

The real joule power dissipated during conduction cycles of NMOS which resistance $R_{N\_SWITCH}$ can be then obtained as:

$$P_{N\_SWITCH} = (1-D) R_{N\_SWITCH} I_{OUT}^2 \quad (6)$$

Applying the recopied current $\alpha I_{out}$ to resistance $R_N/\alpha$ (integrated inside the PED) allows reconstruction of the voltage drop related to total joule losses during the NMOS conduction cycle. This voltage is then:

$$V_{N\_ON\_AVG} = I_{OUT} R_N \quad (7)$$

The joule losses due to the NMOS condition phase are therefore:

$$P_N = (1-D) R_N I_{OUT}^2 \quad (8)$$

Considering the short mathematical demonstration presented above, it should be appreciated that the ohmic losses and switching losses may be identified and estimated during operation of the SPS circuit. In one embodiment of the disclosure, it is proposed that the PED module 300 be adapted to create replica of the ohmic losses, and to compare the replica with switching losses occurring during the operation.

The internal structure of a NMOS power transistor is different than the internal structure of the PMOS power transistor. Indeed, different doping solutions, internal structure and types of charge carriers are used during the conception of a NMOS or PMOS transistor. Hence, ohmic and switching losses are different in a PMOS transistor than in a NMOS transistor. To measure and create replica losses, a specific circuit for the peak-efficiency detection of the NMOS transistor and the PMOS transistor may be realized. In the following description, the case of a NMOS transistor is described. Further, as shown on FIG. 1 and FIG. 2, the input signal of the PED module 300 is provided by the output VLX, CMD_P and CMD_N of the SPS module 200.

Figure 8:
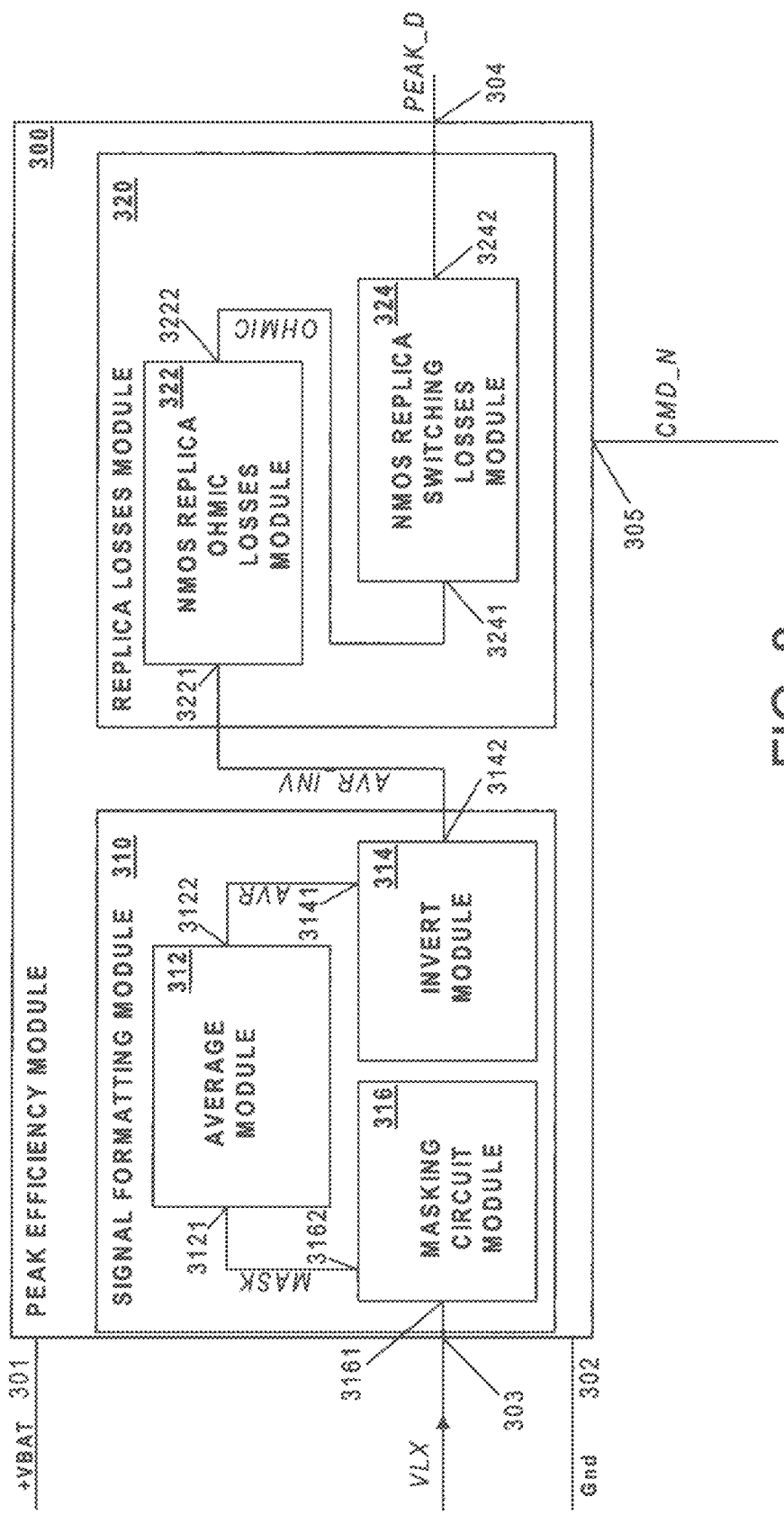
FIG. 8 is a simplified block diagram of a PED module according to another embodiment of this disclosure.

The PED module 300 (as shown in FIG. 8) may be adapted to receive, on its inputs 301 and 302, the supply voltages +VBAT and Gnd, respectively, from the power supply source. An input 305 may be adapted to receive the output signal CMD_N, an input may be adapted to receive the output signal CMD_N from the SPS module, while another input 303 may be adapted to receive the output signal VLX from the SPS module, and still other inputs may be adapted to receive respectively the signal EN_P and the signal EN_N from the Power Stage Size control module. Further, the PED module 300 may be adapted to provide on an output 304 an output signal named PEAK_D which is representative of the efficiency of the SPS module 200.

For a better understanding of the disclosure, in the following description the case with a peak efficiency module 300 for a NMOS transistor is described.

The internal structure FIG. 8 of the PED module 300 can be divided in two main modules, such as a signal formatting module 310 (FIG. 10), and a replica of ohmic losses module 320. These modules can include several internal functions provided by integrated electronic circuits such as resistors, capacitances, OAs, and transistors that are described in more detail below.

In order to discriminate in the VLX signal the duration of the conduction of the PMOS transistors and the duration of conduction of the NMOS transistors, the signal formatting module 310 comprises three modules, namely a first module called the masking circuit module 316, a second module called the average module 312, and a third module called the invert module 314.

The masking circuit module 316 has an input 3161 coupled to the input 303 of the PED module 300, and this input is adapted to receive the signal VLX from the SPS module. The masking circuit module 316 is adapted to provide a filtered signal named MASK on an output 3162.

The average module 312 is adapted to receive on an input 3121 the signal MASK from the masking circuit module 316, and is adapted to provide an output signal named AVR on an output 3122 where the output signal AVR is the average value of the signal MASK. The invert module 314 is adapted to receive on an input 3141 the signal AVR from the output of the average module 312, and to provide on an output 3142 an output signal named AVR_INV, that is to say the inverted value of the input signal thereof.

Figure 9:
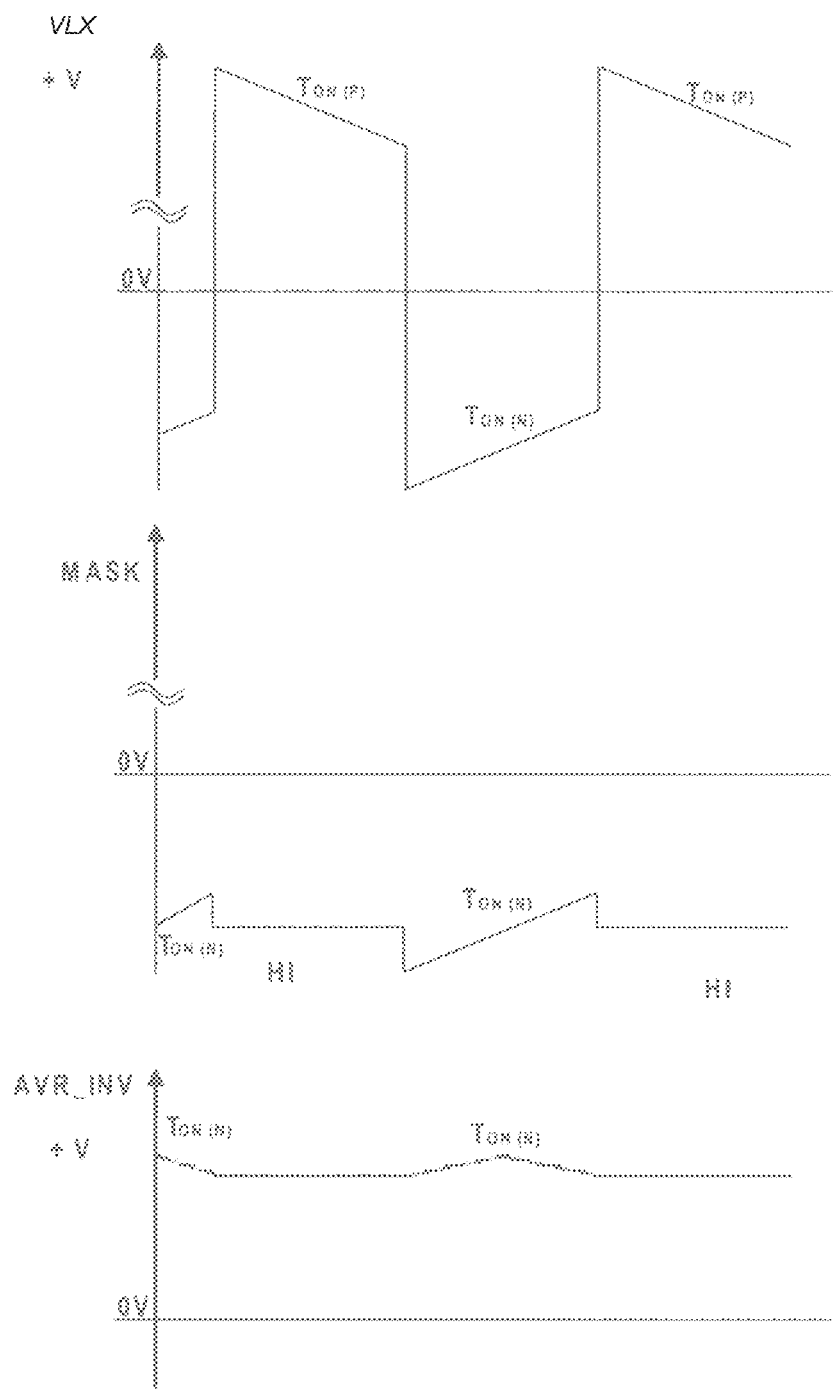
FIG. 9 shows a sequence, as a function of time, of signals and voltages of the device according to embodiments of this disclosure.
Figure 10:
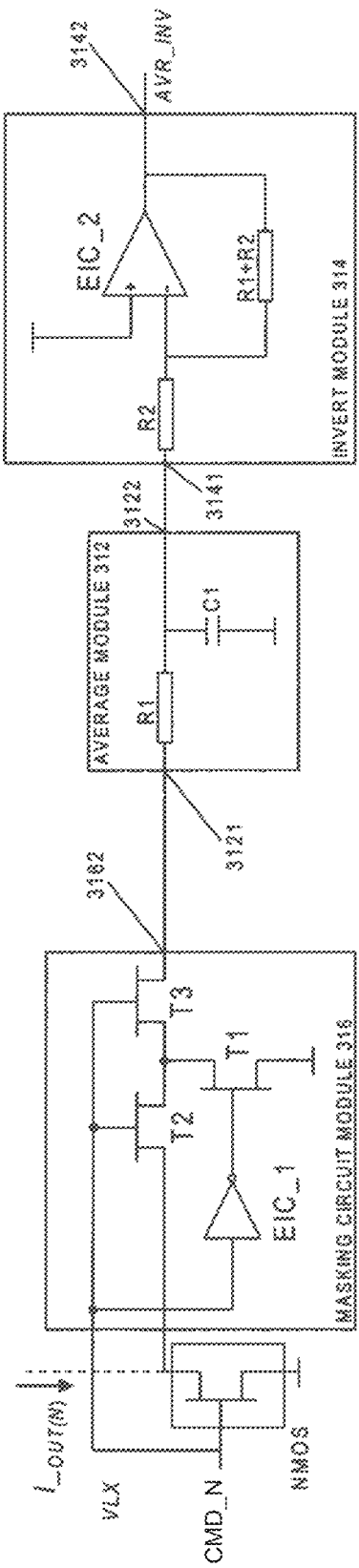
FIG. 10 is an example of internal electronic circuitry of a first main module of the PED module, in accordance with this disclosure.

The graph on FIG. 9 shows the several output signals of the three modules of the signal formatting module 310. The masking circuit module 316 helps to remove the high voltage from the VLX signal so as to keep the NMOS signal (signal across the NMOS ON resistance when this transistor is conducting). An example of electronic circuit performing this function is shown in FIG. 10. This electronic circuit comprises an electronic inverter circuit EIC_1 coupled to a first MOS transistor T1, and two other transistors T2 and T3. This electronic circuit senses the voltage across the NMOS switches when it is ON (conducting), provides the output signal MASK during the NMOS transistor conduction period $T_{ON(N)}$, and sets the output 3162 to a high impedance in the remaining time.

Estimating the losses in the NMOS transistor is based on the averaging during one conduction cycle. Therefore, the average module 312 provides on this output 3122 an average value of the input signal 3121 from the masking circuit module 316. On FIG. 11, an example of electronic circuit performing this function is shown. The average function is constructed from a RC filter which provides an average voltage only during the transistor conduction (when transistor is 'ON'), and holds the average voltage on the filter capacitor afterwards.

For a simplest circuitry of the PED module, an inverted value of the signal may be provided by the invert module 314. To that end, the invert module 314 may be adapted to invert the input signal AVR and to provide an output signal with an inverted value of the AVR signal. This function can be obtained by an operational amplifier EIC_2 with an amplification gain of −1 (FIG. 10).

The electronics circuits and circuitries presented above for the modules 312, 314, 316 are presented in the present description for exemplary purpose of only. Other types of circuits, electronic components could be used for realizing these different modules. Also, in other embodiments, digital circuits such as ASIC, FPGA or any other type of programmable electronic circuits could be used to design this module in part or in totality.

As explained above, one function of the PED module is to create a replica of the ohmic losses and compare it to the switching losses during the conduction phase of the NMOS transistor of the SPS module.

Figure 11:
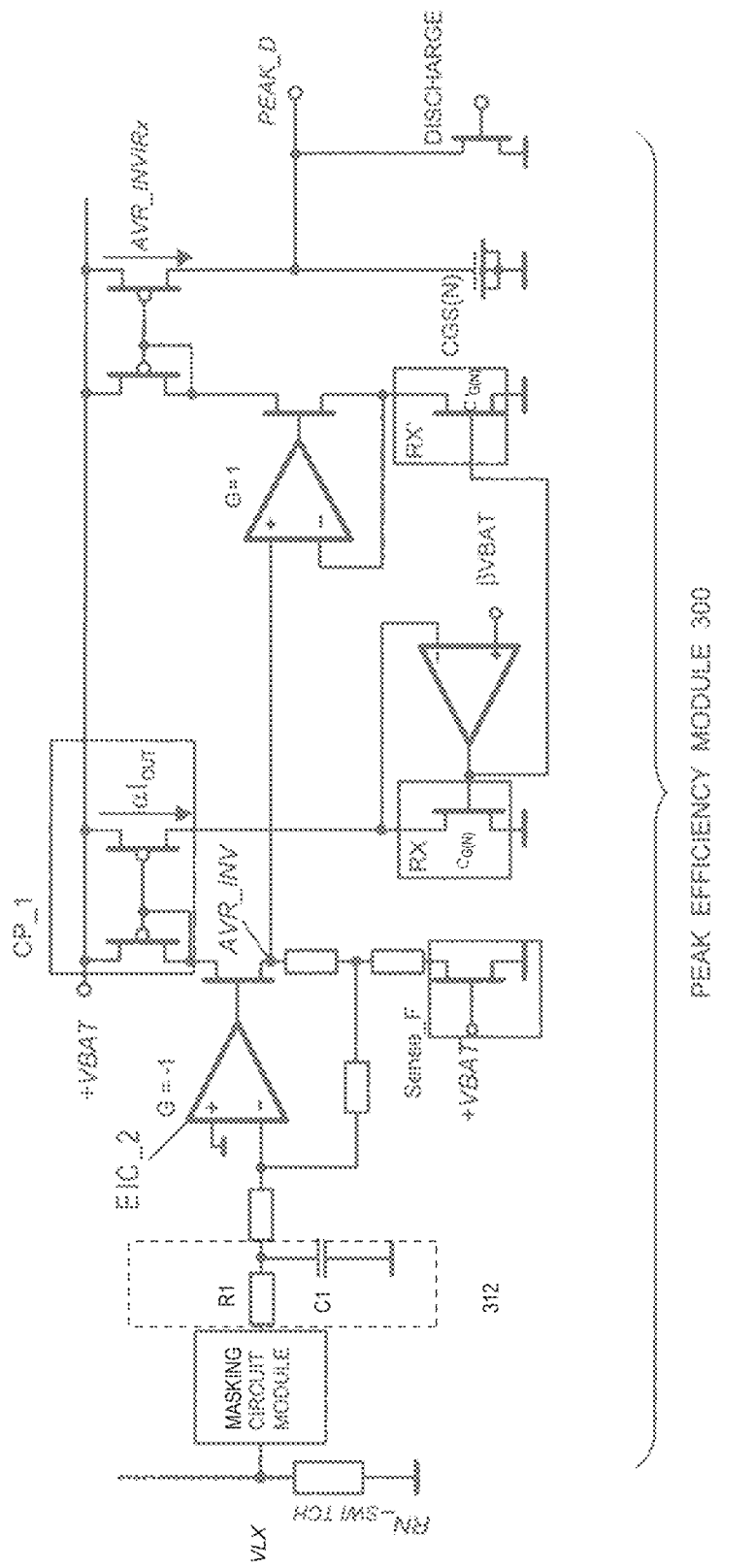
FIG. 11 is an example of internal electronic circuitry of a second main module of the PED module, in accordance with this disclosure.

In one embodiment, the NMOS replica ohmic loss module (FIG. 9) may comprise an electronic circuit adapted to create a replica of the ohmic losses in the NMOS transistor, namely parasitic resistance losses and coupling resistances losses, for instance. The NMOS replica ohmic loss module is adapted to provide a replica output current of the NMOS transistor of the SPS circuit current during the conduction phase thereof. As will be appreciated by the one skilled in the art, a sense-FET transistor could be used for creating a replica current (FIG. 11).

To obtain a replica current, the sense-FET transistor Sense_F may be designed with a scaled coefficient named a-scaled allows obtainment of a scaled resistance (weighted by the a-scaled coefficient) to the ohmic resistance of the NMOS transistor used in the SPS circuit for instance. This sense-FET provides a replica current with a smaller area and a smaller consumption of current.

As explained above several ohmic losses appear during the conduction of the NMOS transistor. In another embodiment an electronic circuit may allow creation of a scaled auxiliary resistor Rx (FIG. 11).

The two electronic circuits presented above allow obtainment of the replica of the current though the Sense-FET independently of the duty cycle D of the output signal VLX.

To fully estimate and replicate the ohmic losses in a SPS module, it is possible to create a copy resistor RN/α arranged to provide the power dissipated in the power MOS transistor. In one embodiment, there is a "sense" resistor with a gain alpha a (FIG. 11). An important fact is that the current passing through the scaled sense-FET is the absolute-value replica of the output current, i.e. has no duty-cycle dependency, and the real power dissipated during the conduction cycles of NMOS transistor is equal to a resistance $R_{NMOS}$ $$P_{NMOS}=(1-D)R_{NMOS} \times I^2_{OUT} \tag{6}$$

Applying the recopied current $\alpha I_{out}$ to the sensor resistor allows recreation of a voltage drop related to total joule losses during the NMOS conduction cycle. This voltage is then:

$$V_{N\_ON\_AVG}=I_{OUT}R_N \tag{7}$$

The joule losses due to the NMOS conduction phase are therefore:

$$P_N=(1-D)R_N I_{OUT}^2 \tag{8}$$

The method allowing detecting of the peak efficiency operation presented here relies on a circuit that allows transferring of the amount of energy dissipated on the parasitic resistance $R_{N\_SWITCH}$ to an auxiliary capacitor $C_{G(N)}'=C_{G(N)}$. In doing so, when both energies are equilibrated (the energy to charge capacitor $C_{G(N)}$ and joule heat energy dissipated on $R_N$), capacitor $C_{G(N)}'$ will be charged to $V_{BAT}$ at the peak efficiency operating point. Stated otherwise, in a case of a peak efficiency operation, the auxiliary capacitor stores an identical amount of energy as the energy being dissipated on the resistance $R_N$ during one conduction cycle.

The methodology introduced here is demonstrated on the NMOS part of the power switch. However, as already mentioned, two independent circuit allowing efficiency optimization of NMOS and PMOS power switches are to be implemented.

The principle of the method can appear from the definition of the work used to establish a defined voltage across the capacitor plates. This work can be developed as:

$$W = \int_0^Q V\,dq = \int_0^Q \frac{q}{C}\,dq = \frac{1}{2}CV^2 = \frac{1}{2}VQ \tag{9}$$

From physical definition, electrical charge Q is defined as the current by time product. On this account, the last term in Eq. (9) can be written into following (unusual) form:

$$W=\tfrac{1}{2}V_{BAT}Q=\tfrac{1}{2}V_{BAT}I_B T_{CLK} \tag{10}$$

where $I_B$ is constant bias current which is to be applied to the auxiliary capacitor $C_{G(N)}'$. However, this equation is valid when $I_B T_{CLK}=C \cdot V_{BAT}$. For one particular value of $I_B$, we can obtain an exact voltage $V_{BAT}$ across the capacitor at $t=T_{CLK}$.

In the process of capacitor charging, half to the energy is dissipated on the resistive switch and half is stored in the capacitor. On this account, term ½ in Eq. (9) disappears. Now, it can be combined with Eq. (8) resulting in the energy balance:

$$(1-D)R_N I_{OUT}^2 = I_B T_{CLK} V_{BAT} f_{sw} \tag{11}$$

Eq. 11 can be simplified by decreasing the time of integration from $T_{CLK}$ to $(1-D)T_{CLK}$. Then $T_{ON}(N)=T_{CLK}(1-D)$ and Eq. 11 results in:

$$R_N I_{OUT}^2 = I_B T_{ON(N)} V_{BAT} f_{SW} \tag{12}$$

By rearranging this Eq. (12), the bias current value can be obtained as:

$$I_B = \frac{I_{OUT}R_N}{V_{N\_ON\_AVG}} \cdot \frac{\alpha I_{OUT}}{\beta V_{BAT} \frac{1}{R_X}} \tag{13}$$

If such a current is applied to the capacitor $$C'_{G(N)} = \frac{\alpha}{\beta} C_{G(N)},$$

the voltage $V_{C(GN)}$ reaching $V_{BAT}$ at the end of integration interval signifies that the power switch operates at the peak efficiency.

In fact, Eq. (13) allows realization of a linear circuit allowing measurement of the average energy dissipated on the $R_N$ resistance during one clock period, and storage of an identical amount of energy in the auxiliary capacitor $C_{G(N)}'$. Otherwise, if $V_{CG(N)}$ voltage is lower than $V_{BAT}$ at the end of the integration time which corresponds to the $T_{ON}$ of the NMOS transistor, then the switching dynamic losses are dominating (power-MOS size is to be decreased), and on the contrary, when $V_{CG(N)}$ exceed the battery voltage at $t=T_{ON}$, the ohmic losses are dominating and the power MOS size is to be increased.

For that, the NMOS replica switching losses module 324 is adapted to receive on an input 3241 the signal OHMIC from the NMOS replica ohmic losses module 322, and is adapted to provide on an output 3242 an output signal PEAK_D that is a replica of the total losses (ohmic losses and switching losses) of the SPS module 200. This module may use an auxiliary capacitor $C'_{G(N)}$ where:

$$C'_{G(N)}=C_{G(N)} \tag{16}$$

The value of the auxiliary capacitor $C'_{G(N)}$ is determined during the conception of the NMOS replica switching losses module 324 and is in accordance with the intrinsic characteristics of the capacitor of the SPS circuit. An example of implementation is presented on FIG. 11.

In other embodiment, an ohmic loss replica module is used. This ohmic loss replica module is designed to create a replica of total ohmic losses for the SPS circuit configurations. A control signal from the power size stage control module in other embodiments of the disclosure could be used to select a part of ohmic replica losses of the ohmic loss replica module in accordance with the number of activated SPS circuits.

As explained above, the maximum peak efficiency appears when the ohmic losses are identical to the switches losses. The detection of operation at the peak efficiency relies on a circuit that allows transfer of the amount of power dissipated on the parasitic resistances to an auxiliary capacitor $C'_{G(N)}$. When both powers are balanced (the power to charge capacitor $C_{G(N)}$ and the joule power dissipated on $R_N$ during one conduction cycle), then the capacitor $C'_{G(N)}$ is charged to VBAT at the peak efficiency operating point. Stated otherwise, in a case of peak efficiency operation, auxiliary capacitors store an identical amount of power as the power being dissipated on the resistance $R_N$ during one conduction cycle.

Figure 12:
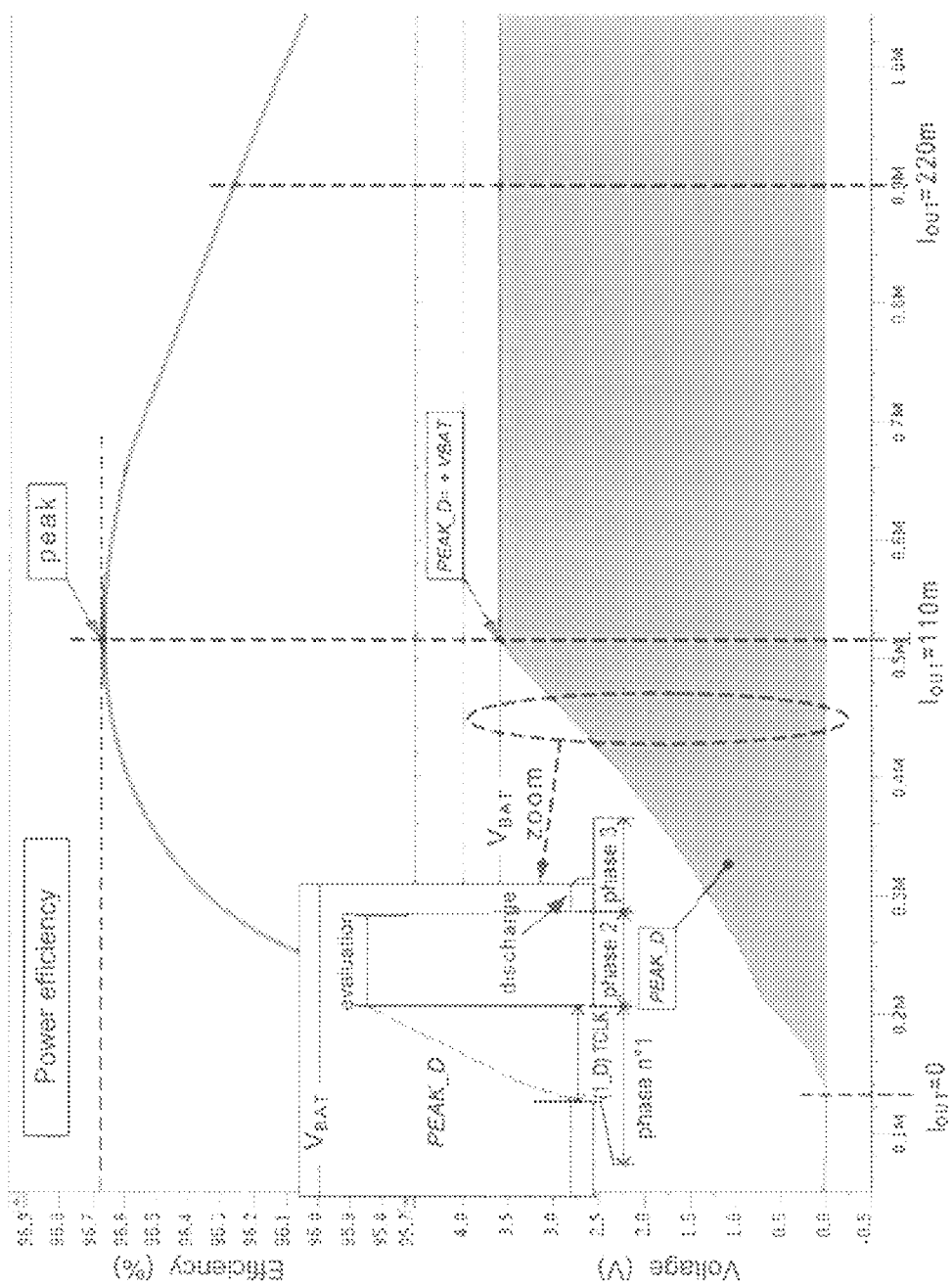
FIG. 12 is a graph representing the simulation of the peak efficiency detection, in accordance with this disclosure.

The graph on FIG. 12 shows simulation results of a peak efficiency detection device. In order to describe operation of the device, simulations were performed with real NMOS power transistor mathematical models, with a linear sweep of the output current (load current) from 0 to 300 mA. In these simulations, the integration time is $T_{ON}$. The maximum peak efficiency was obtained when the voltage of the capacitors $C'_{G(N)}$ is equal to +VBAT.

In FIG. 12, a zoom allows highlighting of the different phases which enable obtainment of the maximum peak efficiency. Three phases of operation are identified, namely:

Phase No. 1: integration time, when current $I_B$ of FIG. 11 is applied to $C_{G(N)}'$, of FIG. 11.

Phase No. 2: evaluation phase, when the capacitor holds the integrated voltage value and value of the integrated voltage is evaluated, and Phase No. 3: capacitor reset phase.

The phase No. 1 allows charging $C'_{GS}$ of FIG. 11 by a current $I_B$ of FIG. 11 during the time of the conduction of the power NMOS transistor in SPS circuit. The charging of this capacitance is performed by a constant current and the duration of this charging is equal to the conduction time of related transistor.

The phase No. 2 allows evaluation of the voltage across the capacitor $C'_{GS}$ in the power stage size control module by comparator. Further, as explained above, when the value of this signal is below the value +VBAT, that signifies that the switching losses are dominating the ohmic losses, and when the voltage value is above or in our case equal to +VBAT that signifies the ohmic losses are dominant compared to the switching losses. The regulations of these parameters are made by activating or disabling segments of the SPS circuit. $V_{CAP}$ reaches +VBAT at the point of maximum efficiency.

The phase No. 3 allows discharging of the power stored in the capacitor $C'_{GS}$ quickly before another phase of efficiency regulation. This discharge of the capacitor $C'_{GS}$ could be performed by a transistor coupled in parallel to the capacitor, and the discharge time is controlled by the internal resistor of the transistor.

In one embodiment of the disclosure, the power stage modulation strategy could be exploited via real time power stage size tuning. This allow regulation of the size of the power stage with a defined power regulation strategy for obtaining an optimal peak efficiency of the SPS module.

Figure 13:
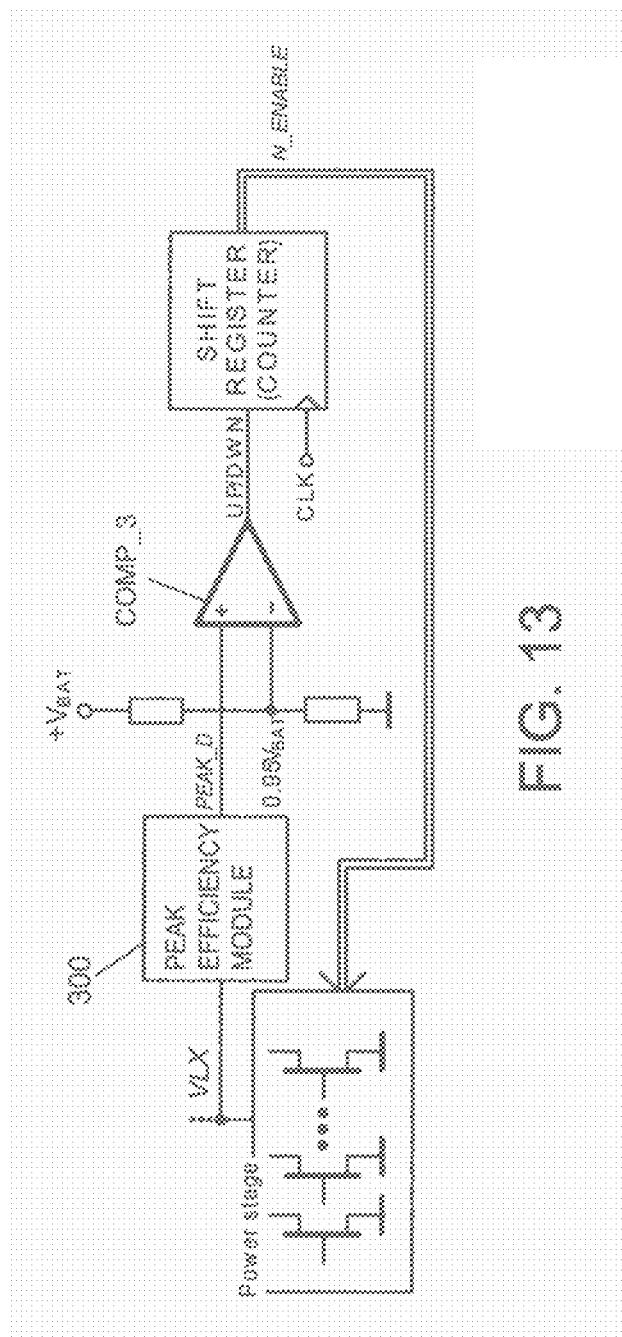
FIG. 13 is a block diagram of the internal electronic circuitry of the power stage size control module (for peak efficiency tracking) according to another embodiment of this disclosure.

In this embodiment, a real time tuning of the size of the power supply stage is performed, as shown on FIG. 13 an example of electronic circuit. The power stage size control module includes a comparator electronic circuit COMP_3 and a shift register. This shift register is adapted to receive on an input the signal PEAK_D from the PED module 300 and to receive on a second input a clock signal CLK. It allows activation or deactivation of the SPS circuits incrementally.

To summarize, the SPS module is configured to dynamically activate or deactivate at least one of the SPS circuits operating to generate the output supply signal V_OUT on the internal node, when the signal PEAK_D representative of the efficiency of the SPS module is lower than a threshold value (close to VBAT). This means that the switching losses of the SPS module are greater than the ohmic losses. When the signal PEAK_D representative of the efficiency of the SPS module is higher than a second threshold value, this means that the ohmic losses of the SPS module are greater than the switching losses.

This is explained with reference to FIG. 14. There are shown therein three curves in dotted lines corresponding to the power efficiency of the SPS module having three size activated: 25%, 50% and 100%, respectively, of the SPS module.

Figure 14:
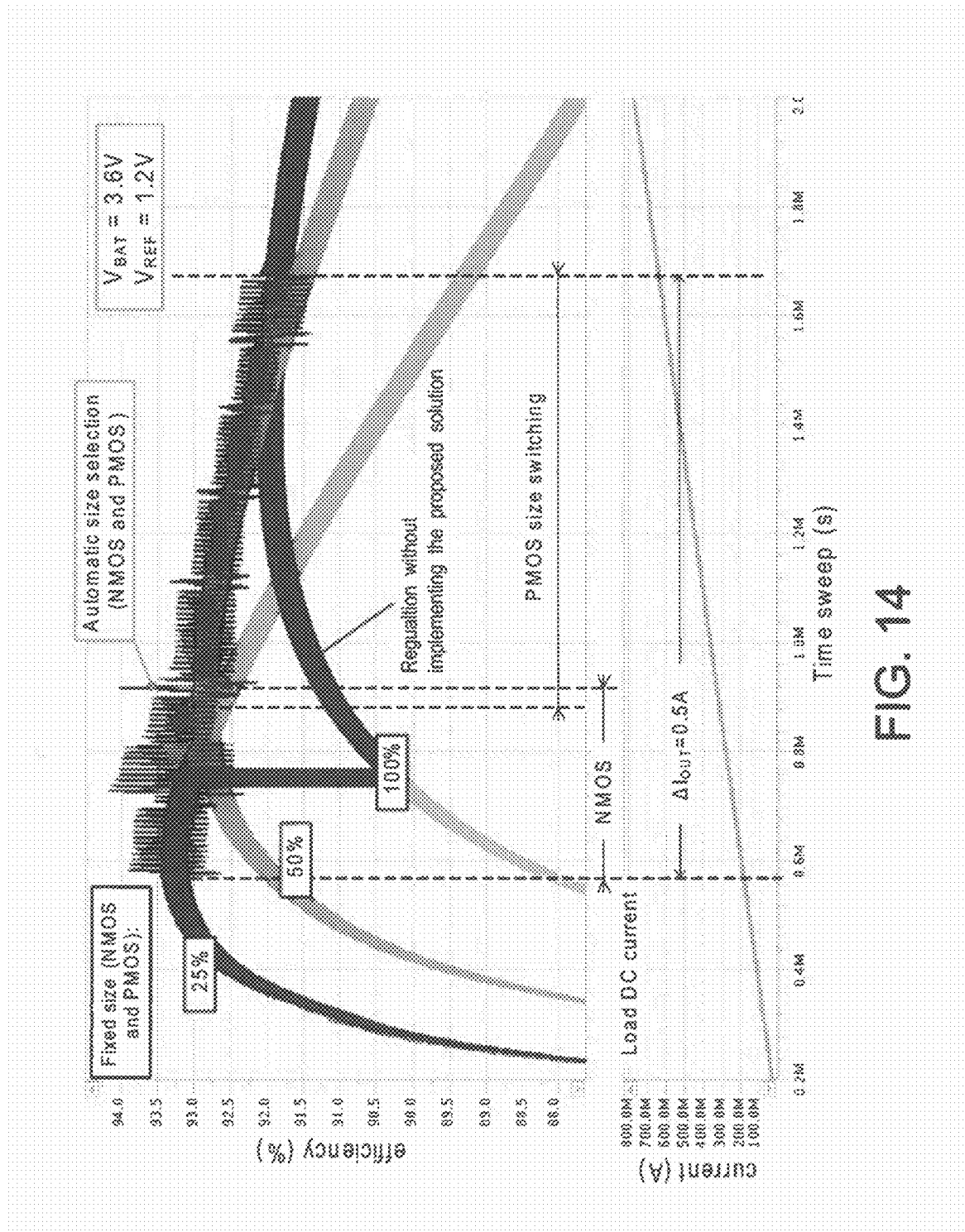
FIG. 14 shows graphs comparing the power efficiency of a switched power supply module embodying the power regulation strategy of this disclosure to that of a switched power supply embodying conventional power regulation strategies.

As shown in FIG. 14, the regulation of the size of the SPS module without implementing the proposed embodiments causes big jumps of the efficiency of the SPS module, represented by the continuous line, during the regulation phase of the SPS module. These jumps correspond to the activation of a second SPS circuit which changes the power efficiency from 25% to 100%. Another typical case without implementing the proposed embodiments is that the power-efficiency follows only 100% power-stage size.

As shown in FIG. 14, the regulation of the size of the SPS module with the defined power regulation strategy and defined internal structure as explained above allows avoidance of big jumps of the efficiency signal PEAK_D during the regulation phase of the SPS module with the power stage size control module as explained above. Thus, the curve in the continuous line in FIG. 14 exhibits faster, but smaller changes of the power efficiency obtained when the proposed regulation scheme is implemented. Moreover, the proposed strategy optimizes the power efficiency with respect to the main parameters having direct impact to the power efficiency value, as the input and output voltage $V_{BAT}/V_{OUT}$, output current $I_{OUT}$, switching frequency $F_{CLK}$, Temperature, and process variations.

While the disclosure has been illustrated and described in details in the drawings and foregoing description, such illustration and description have to be considered as illustrative or exemplary and not restrictive; the disclosure is not limited to the disclosed embodiments. Variations to the disclosed embodiments can be understood and effected by those skilled in the art in practicing the claimed disclosure, from a study of the drawings, the disclosure, and the appended claims. In the claims, the word "comprising" does not exclude other elements or steps, and the indefinite article "a" or "an" does not exclude a plurality. A single or a plurality of programmable circuit or other unit may fulfil the functions of several items recited in the claims. The mere fact that certain measures are recited in mutually different dependent claims does not indicate that a combination of these measures cannot be used to advantage.

The invention claimed is:

1. An electronic device comprising:
   an internal node;
   a switched power supply module comprising a plurality of switched power supply circuits configured to generate an output supply signal on the internal node,
   wherein each of the plurality of switched power supply circuits comprises:
      a PMOS transistor having a first conduction terminal coupled to a first supply voltage and a second conduction terminal coupled to the internal node; and an NMOS transistor having a first conduction terminal coupled to the internal node and a second conduction terminal coupled to a second supply voltage; and a peak efficiency detection module configured to receive the output supply signal and, based thereupon, generate an efficiency signal representative of an efficiency of the switched power supply module;

wherein the efficiency signal being lower than a threshold value indicates that switching losses of the switched power supply module are greater than ohmic losses thereof, and wherein the efficiency signal being higher than the threshold value indicates that the ohmic losses of the switched power supply module are greater than the switching losses thereof;

the switched power supply module configured to switch at least one of the plurality of switched power supply circuits between an activated state and a deactivated state based upon the efficiency signal by biasing control terminals of the PMOS transistor and NMOS transistor of each switched power supply circuit.

2. The electronic device of claim 1, wherein the switched power supply module comprises at least one power switch configured to switch the at least one of the plurality of switched power supply circuits.

3. The electronic device of claim 2, wherein the at least one power switch comprises a power metal oxide semiconducting transistor.

4. An electronic device comprising:

a switched power supply module comprising a plurality of switched power supply circuits configured to generate an output supply signal; and a peak efficiency detection module configured to receive the output supply signal and, based thereupon, generate an efficiency signal representative of an efficiency of the switched power supply module;

wherein the efficiency signal being lower than a threshold value indicates that switching losses of the switched power supply module are greater than ohmic losses thereof, and wherein the efficiency signal being higher than the threshold value indicates that the ohmic losses of the switched power supply module are greater than the switching losses thereof;

wherein the switched power supply module is configured to switch at least one of the plurality of switched power supply circuits between an activated state and a deactivated state based upon the efficiency signal; and serial communication circuitry configured to facilitate communication between the peak efficiency detection module and the switched power supply module.

5. An electronic device comprising:

a switched power supply module comprising a plurality of switched power supply circuits configured to generate an output supply signal; and a peak efficiency detection module configured to receive the output supply signal and, based thereupon, generate an efficiency signal representative of an efficiency of the switched power supply module;

wherein the efficiency signal being lower than a threshold value indicates that switching losses of the switched power supply module are greater than ohmic losses thereof, and wherein the efficiency signal being higher than the threshold value indicates that the ohmic losses of the switched power supply module are greater than the switching losses thereof;

wherein the switched power supply module is configured to switch at least one of the plurality of switched power supply circuits between an activated state and a deactivated state based upon the efficiency signal;

wherein the peak efficiency detection module comprises a signal formatting module configured to generate a formatted signal based upon the output supply signal.

6. The electronic device of claim 5, wherein the peak efficiency detection module further comprises a loss replica module configured to generate a signal representative of the ohmic and the switching losses of the switched power supply module, and being based on the formatted signal.

7. The electronic device of claim 6, wherein the loss replica module comprises a copy transistor configured to replicate, at a scaled ratio, a current through the plurality of switched power supply circuits and to generate therefrom a current representative of the ohmic losses of the plurality of switched power supply circuits.

8. The electronic device of claim 7, wherein the peak efficiency detection module comprises an auxiliary capacitor configured to be charged by the current representative of the ohmic losses of the plurality of switched power supply circuits and to generate based thereupon a voltage signal representative of the switching losses of the plurality of switched power supply circuits.

9. A method of detecting efficiency of a switched mode power supply comprising:

generating an output supply signal on an internal node of a switched power supply module, using a plurality of switched power supply circuits of the switched power supply module, each of the plurality of switched power supply circuits being coupled to the internal node;

generating an efficiency signal representative of an efficiency of the switched power supply module, the efficiency signal being lower than a threshold value indicating that the switching losses of the switched power supply module are greater than the ohmic losses of the switched power supply module, and the efficiency signal being higher than the threshold value indicating that the ohmic losses of the switched power supply module are greater than the ohmic losses of the switched power supply module;

selectively switching at least one of the switched power supply circuits between an activated state and a deactivated state based upon the efficiency signal, by controlling gates of a PMOS transistor coupled in series with an NMOS transistor of that switched power supply circuit, the PMOS transistor and the NMOS transistor being coupled at the internal node.

10. A method of detecting efficiency of a switched mode power supply comprising:

generating an output supply signal on an internal node of a switched power supply module, using a plurality of switched power supply circuits of the switched power supply module;

generating an efficiency signal representative of an efficiency of the switched power supply module, the efficiency signal being lower than a threshold value indicating that the switching losses of the switched power supply module are greater than the ohmic losses of the switched power supply module, and the efficiency signal being higher than the threshold value indicating that the ohmic losses of the switched power supply module are greater than the ohmic losses of the switched power supply module;

selectively switching at least one of the switched power supply circuits between an activated state and a deactivated state based upon the efficiency signal; and generating dead time control signals using a dead time module of the switched power supply module, and controlling a duration of conduction of the plurality of switched power supply circuits based upon the dead time control signals.

11. A method of detecting efficiency of a switched mode power supply comprising:
generating an output supply signal on an internal node of a switched power supply module, using a plurality of switched power supply circuits of the switched power supply module;
generating an efficiency signal representative of an efficiency of the switched power supply module,
the efficiency signal being lower than a threshold value indicating that the switching losses of the switched power supply module are greater than the ohmic losses of the switched power supply module, and the efficiency signal being higher than the threshold value indicating that the ohmic losses of the switched power supply module are greater than the ohmic losses of the switched power supply module;
selectively switching at least one of the switched power supply circuits between an activated state and a deactivated state based upon the efficiency signal; and
generating power stage size control signals using a power stage supply control module;
wherein the selective switching of at least one of the switched power supply circuits is also based upon the power stage size control signals.

12. An efficiency detection device, comprising:
a switched power supply module configured to provide an output supply signal and comprising:
an internal node,
a plurality of switched power supply circuits configured to generate the output supply signal on the internal node, and
a dead time module configured to generate control signals having a period of non-overlap;
a power stage size control module configured to generate signals that control the switched power supply module;
a central node configured to deliver the output supply signal to a load; and
a peak efficiency detection module configured to receive the output supply signal from the central node, the control signals from the switched power supply module, the signals from the power stage size control module, and, based thereupon, generate an efficiency signal representative of an efficiency of the switched power supply module;
the peak efficiency detection module comprising:
a signal formatting module configured to generate a formatted signal based upon the output supply signal, and
a loss replica module configured to generate a signal representative of ohmic and switching losses of the switched power supply module and based on the formatted signal;
wherein the efficiency signal being lower than a threshold value indicates that switching losses of the switched power supply module are greater than ohmic losses thereof, and wherein the efficiency signal being higher than the threshold value indicates that the ohmic losses of the switched power supply module are greater than the switching losses thereof;
wherein the switched power supply module is configured to selectively activate and deactivate at least one of the switched power supply circuits operating to generate the output supply signal on the internal node based upon the signal generated by the peak efficiency detection module.

13. The efficiency detection device of claim 12, wherein the switched power supply module comprises at least one power switch.

14. The efficiency detection device of claim 13, wherein the at least one power switch comprises a power metal oxide semiconducting transistor.

15. The efficiency detection device of claim 12, further comprising serial communication circuitry configured to facilitate communication between the peak efficiency detection module, the power stage size control module, and the switched power supply module.

16. The efficiency detection device of claim 12, wherein the loss replica module comprises a copy transistor configured to replicate, at a scaled ratio, a current through the plurality of switched power supply circuits and to generate therefrom a current representative of the ohmic losses of the plurality of switched power supply circuits.

17. The efficiency detection device of claim 16, wherein the peak efficiency detection module comprises an auxiliary capacitor configured to be charged by the current representative of the ohmic losses of the plurality of switched power supply circuits and to generate based thereupon a voltage signal representative of the switching losses of the plurality of switched power supply circuits.

18. A method of detecting efficiency of an electronic device comprising:
generating an output supply signal on an internal node of a switched power supply module, using a plurality of switched power supply circuits of the switched power supply module;
delivering the output supply signal to a load module, using a central node;
generating an efficiency signal representative of an efficiency of the switched power supply module by
generating a formatted signal based on the output supply signal, using a signal formatting module, and
generating a signal representative of ohmic and switching losses of the switched power supply module based on the formatted signal; and
selectively switching at least one of the switched power supply circuits between an activated state and a deactivated state based on at least one of the efficiency signal being lower than a threshold value, indicating that the switching losses of the switched power supply module are greater than the ohmic losses of the switched power supply module, and based on the efficiency signal being higher than the threshold value, indicating that the ohmic losses of the switched power supply module are greater than the ohmic losses of the switched power supply module.

19. The method of claim 18, further comprising generating dead time control signals using a dead time module of the switched power supply module, and controlling a duration of conduction of the plurality of switched power supply circuits based upon the dead time control signals.

20. The method of claim 18, further comprising generating power stage size control signals using a power stage supply control module, and controlling switching of transistors of at least one of the plurality of switched power supply circuits based upon the power stage size control signals.

* * * * *

UNITED STATES PATENT AND TRADEMARK OFFICE
CERTIFICATE OF CORRECTION

PATENT NO.        : 9,537,395 B2                              Page 1 of 1
APPLICATION NO.   : 14/518039
DATED             : January 3, 2017
INVENTOR(S)       : Michal It is certified that error appears in the above-identified patent and that said Letters Patent is hereby corrected as shown below:

In the Specification

Column 11, Line 3, replace [[a-scaled]] with -- α-scaled --.

Column 11, Line 4, replace [[a-scaled]] with -- α-scaled --.

Column 11, Line 19, replace [[alpha a]] with -- alpha α --.

Signed and Sealed this
Fourteenth Day of February, 2017

Michelle K. Lee
*Director of the United States Patent and Trademark Office*